United States Patent

Hirano

[11] Patent Number: 5,969,979
[45] Date of Patent: Oct. 19, 1999

[54] FERROELECTRIC MEMORY DEVICE

[75] Inventor: Hiroshige Hirano, Nara, Japan

[73] Assignee: Matsushita Electronics Corporation, Osaka, Japan

[21] Appl. No.: 08/952,898

[22] PCT Filed: Mar. 19, 1997

[86] PCT No.: PCT/JP97/00893

§ 371 Date: Nov. 25, 1997

§ 102(e) Date: Nov. 25, 1997

[87] PCT Pub. No.: WO97/36300

PCT Pub. Date: Feb. 10, 1997

[30] Foreign Application Priority Data

Mar. 25, 1996 [JP] Japan .................................. 8-067740

[51] Int. Cl.⁶ .............................................. G11C 11/22
[52] U.S. Cl. ................................... 365/145; 365/149
[58] Field of Search ..................................... 365/145, 149

[56] References Cited

U.S. PATENT DOCUMENTS

| | | | |
|---|---|---|---|
| 4,873,664 | 10/1989 | Eaton, Jr. ............................ | 365/145 |
| 5,297,077 | 3/1994 | Imai et al. ......................... | 365/145 |
| 5,373,463 | 12/1994 | Jones, Jr. .......................... | 365/145 |
| 5,572,459 | 11/1996 | Wilson et al. .................... | 365/145 |

FOREIGN PATENT DOCUMENTS

| | | |
|---|---|---|
| 0 674 317 | 9/1995 | European Pat. Off. . |
| 0 702 372 | 3/1996 | European Pat. Off. . |
| 63-201998 | 8/1988 | Japan . |
| 6-232361 | 8/1994 | Japan . |
| 7-262768 | 10/1995 | Japan . |
| 93/12542 | 6/1993 | WIPO . |

OTHER PUBLICATIONS

European Search Report for Int'l Appln. No. 97907378 dated Apr. 9, 1998.

Japanese language search report for Int'l Appln. No. PCT/JP97/00893.

English translation of Japanese search report for Int'l Appln. No. PCT/JP97/00893.

*Primary Examiner*—David Nelms
*Assistant Examiner*—M. Tran
*Attorney, Agent, or Firm*—Ratner & Prestia

[57] ABSTRACT

To present a ferroelectric memory device capable of further decreasing fluctuations of reference potential in reference memory cell system. To achieve the object, the ferroelectric memory device comprises, as shown, for example, in FIG. 1, a reference potential generating circuit in a system for generating a reference potential by averaging the potentials being read out from two ferroelectric capacitors for reference memory cells CD00, CD20 storing data of high level, and two ferroelectric capacitors for reference memory cells CD10, CD30 storing data of low level.

11 Claims, 8 Drawing Sheets

FERROELECTRIC MEMORY DEVICE

TECHNICAL FIELD

The present invention relates to a ferroelectric memory device.

BACKGROUND ART

Recently, by using a ferroelectric material in the capacitor of memory cell, a ferroelectric memory device realizing nonvolatility of stored data is devised. The ferroelectric capacitor has a hysteresis characteristic, and if the electric field is zero, a residual polarization of different polarity depending on the hysteresis is left over. By expressing the stored data by the residual polarization of the ferroelectric capacitor, a nonvolatile memory device is realized. The specification of U.S. Pat. No. 4,873,664 discloses two types of ferroelectric memory device.

In a first type, a memory cell is composed of one transistor and one capacitor per bit (1T1C), and a ferroelectric capacitor for reference memory cell is provided in, for example, every 256 ferroelectric capacitors for main body memory cells (normal cells).

In a second type, without using ferroelectric capacitor for reference memory cell, a memory cell is composed of two transistors and two capacitors per bit (2T2C), in which a pair of complementary data are stored in a pair of ferroelectric capacitors for main body memory cell.

For a larger memory capacity, the 1T1C type is advantageous, and at this time, for low voltage operation and operation for a longer life, the design of ferroelectric capacitor for reference cell is important in the ferroelectric cell capacitor for main body memory cell.

As the ferroelectric material for composing capacitor, $KNO_3$, $PbLa_2O_3$—$ZrO_2$—$TiO_2$, and $PbTiO_3$—$PbZrO_3$ are known among others. According to PCT International Disclosure No. WO93/12542 Publication, ferroelectric materials extremely small in fatigue as compared with $PbTiO_3$—$PbZrO_3$ suited to ferroelectric memory device are also known.

The constitution of conventional ferroelectric memory device of 1T1C type is described briefly below.

Figure 7:
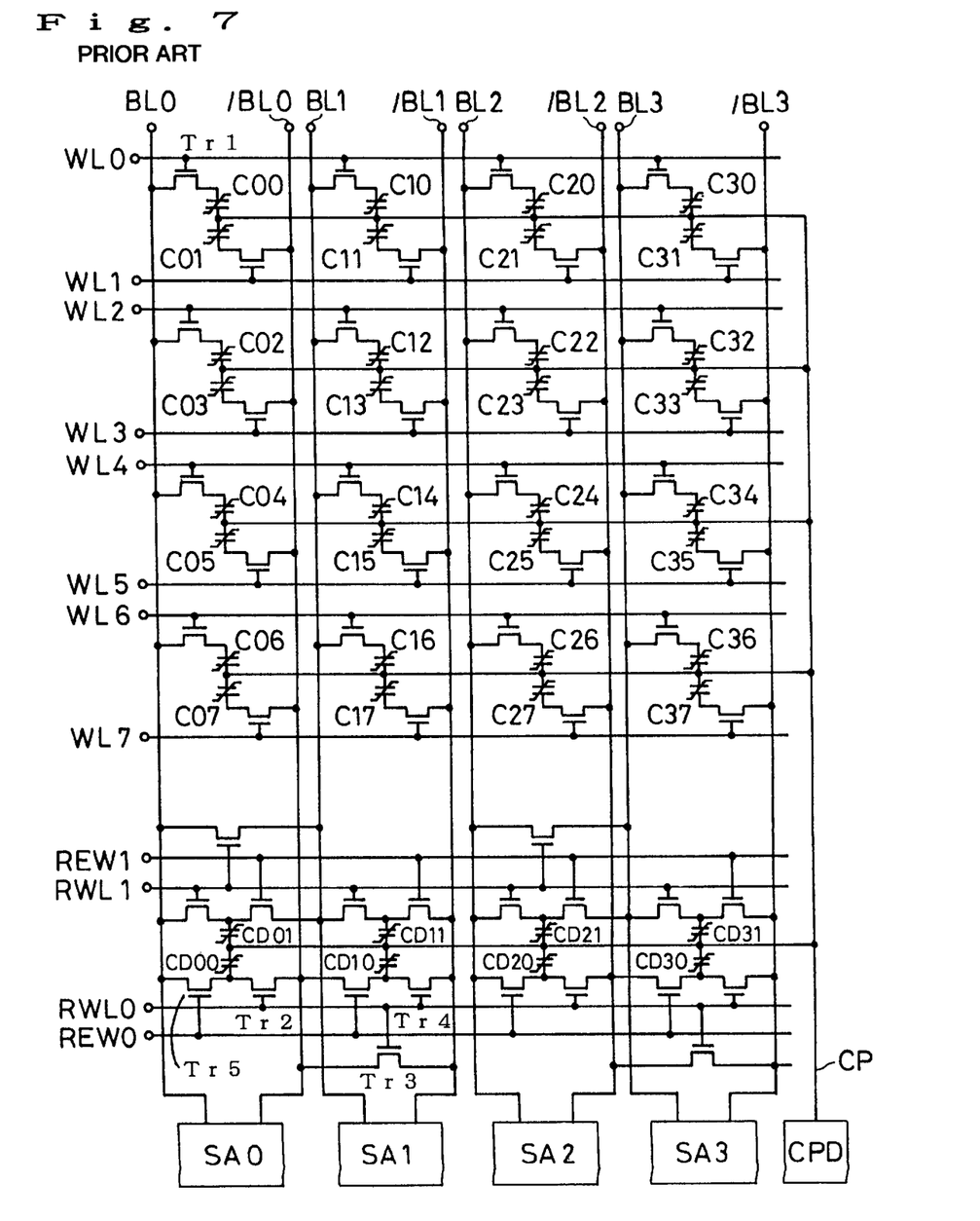
FIG. 7 is a memory cell block diagram in a prior art.
Figure 8:
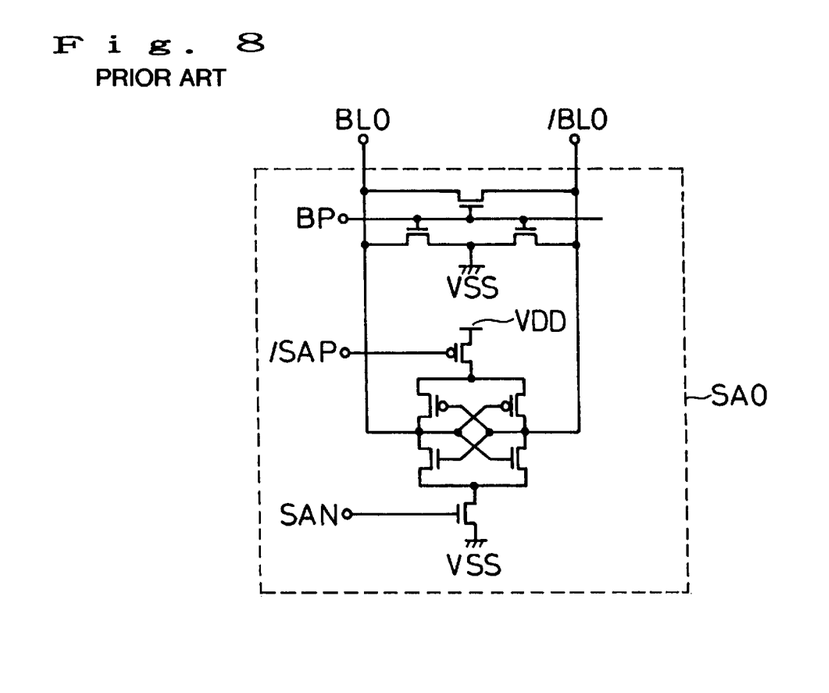
FIG. 8 is a sense amplifier circuit diagram in a prior art.
Figure 9:
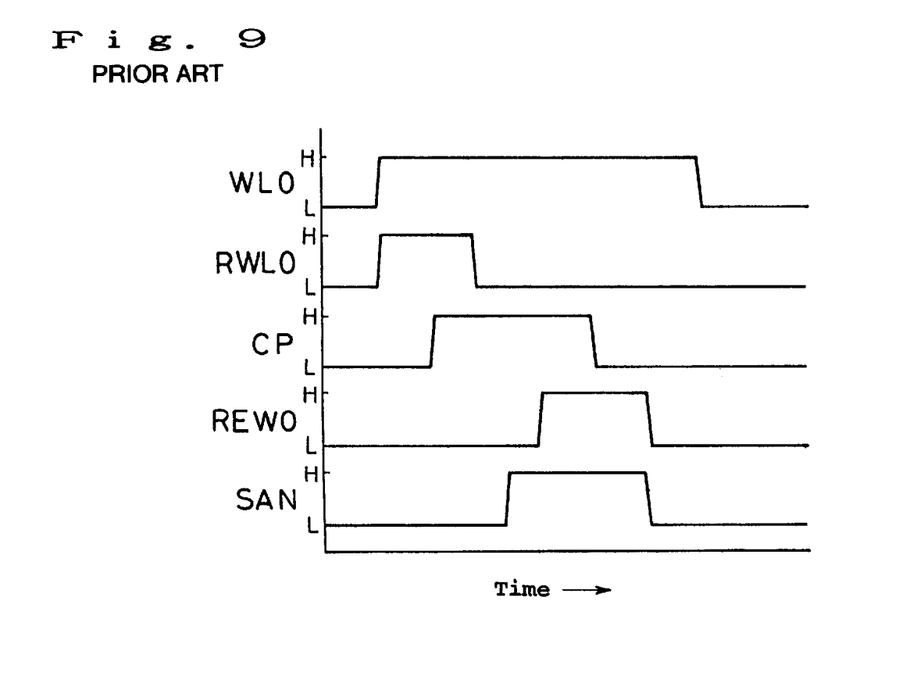
FIG. 9 is an operation timing diagram in a prior art.

FIG. 7 is a memory cell block diagram, FIG. 8 is a sense amplifier circuit diagram, and FIG. 9 is an operation timing chart.

In FIG. 7, C00 to C37 refer to ferroelectric capacitors for main body memory cells, CD00 to CD31 are ferroelectric capacitors for reference memory cells, CPD is a cell plate driver, and REW0 and REW1 are reference memory cell rewrite signal lines. In addition, SA0 to SA3 are sense amplifiers, and CP is a cell plate signal. And WL0 to WL7 are word lines, RWL0 and RWL1 are reference word lines, and BL0 to BL3, /BL0 to /BL3 are bit lines. In FIG. 8 and FIG. 9, BP is a bit line precharge signal, and /SAP, SAN are sense amplifier control signals. Besides, VSS is a grounding voltage, and VDD is a supply voltage.

In the memory cell composition, for example as shown in the diagrams, bit lines BL0 and /BL0 are connected to the sense amplifier SA0. Further, a ferroelectric capacitor for main body memory cell C00 is connected to the bit line BL0 through an N-channel MOS transistor Tr1 having word line WL0 as its gate. To the bit line /BL0, moreover, a ferroelectric capacitor for reference memory cell CD00 is connected through an N-channel MOS transistor Tr2 having reference word line RWL0 as its gate. The ferroelectric capacitors C00, CD00 are connected to the cell plate signal line CP which is driven by the cell plate driver CPD.

The bit lines /BL0 and /BL1 are connected through an N-channel MOS transistor Tr3 having the reference word line RWL0 as its gate. The bit line BL0 and ferroelectric capacitor for reference memory cell CD00 are connected through an N-channel MOS transistor Tr5 having the reference memory cell rewrite signal line REW0 as its gate.

As shown in FIG. 8, the sense amplifier SA0 is controlled by sense amplifier control signals /SAP, SAN, and the circuit is thus composed so that precharge of bit lines BL0 and /BL0 is controlled by the bit line precharge signal BP.

In this conventional ferroelectric memory device in 1T1C composition is based on a method of using two ferroelectric capacitors of nearly same size as the ferroelectric capacitor for main body memory cell, reading out one H (high) data and one L (low) data, and averaging these two data (see Japanese Laid-open Patent No. 7-262768).

The operation of this conventional ferroelectric memory device of 1T1C composition is described by referring to FIG. 9, mainly relating to selection of word line WL0.

First, the bit lines BL0 and /BL0 are precharged to logic voltage L when the bit line precharge signal BP is H. Similarly, the bit lines BL1 and /BL1 are precharged to logic voltage L.

Consequently, when the bit line precharge signal BP is set to logic voltage L, the bit lines BL0 and /BL0, and the bit lines BL1 and /BL1 are set in floating state.

Next, the word line WL0 and reference word line RWL0 are set in logic voltage H, and the cell plate signal line CP is set to logic voltage H. Herein, the potential level of logic voltage H of the word line WL0 is a voltage boosted over the supply voltage VDD. Since the reference word line RWL0 is set to logic voltage H, the N-channel MOS transistors Tr2 to Tr4 are turned on. In this description, as mentioned above, for example, when the word line WL0 is set to logic voltage H, it means that the potential of the word line WL0 is set to logic voltage H.

At this time, an electric field is applied to both electrodes of the ferroelectric capacitors C00, CD00, C10, CD10 individually, and each potential is determined by the capacity ratio of the ferroelectric capacitor and bit line capacity. Their potentials are read out from the individual bit lines BL0, /BL0, BL1, /BL1.

At this time, the data being read out from the ferroelectric capacitor for reference memory cells CD00 and CD10 are averaged data (potential) of the two data because the N-channel MOS transistors Tr2 to Tr4 are turned on and hence the bit lines /BL0 and /BL1 are connected electrically. Herein, H (high) data is recorded in the ferroelectric capacitor for reference memory cells CD00 and CD01, and L (low) in the ferroelectric capacitor for reference memory cells CD10 and CD11.

Then, setting the reference word line RWL0 to logic voltage L, and turning off the N-channel MOS transistors Tr2 to Tr4, the bit line /BL0 and bit line BL1 are electrically disconnected.

Consequently, the sense amplifier control signal /SAP is set to logic voltage L and the SAN to logic voltage H, the sense amplifier is operated.

As a result, the potential being read out to the bit line is amplified to the supply voltage VDD and grounding voltage VSS.

The reference memory cell rewrite signal line REW0 is set to logic voltage H, so that it is now ready to write the potentials of H (high) and L (low) for next reading operation, in the ferroelectric capacitors for reference memory cells CD00 and CD10.

As the rewriting operation, consequently, the cell plate signal CP is set to logic voltage L. Afterwards, the bit line precharge signal BP is set to logic voltage H and the bit lines BL0 and /BL0 are precharged to logic voltage L, and the word line WL0 and reference word line RWL0 are set to logic voltage L, to be set in initial state.

In this way, in the conventional ferroelectric memory device of 1T1C type, when the word line WL0 is selected, the reference potential used when reading out the potentials of the bit line BL0 and bit line BL1 is the average of the ferroelectric capacitor for reference memory cells CD00 and CD10. The average value is read out from the bit lines /BL0 and /BL1. The reference potential used when reading out the potentials of the bit line BL2 and bit line BL3 is the average of the ferroelectric capacitor for reference memory cells CD20 and CD30. The average value is read out from the bit lines /BL0 and /BL1.

Incidentally, when the word line WL1 is selected, the role of the bit line pair is reversed, and the ferroelectric capacitors for reference memory cells are also different.

That is, the reference potential used when reading out the potentials of the bit line /BL0 and bit line /BL1 is the average of the ferroelectric capacitor for reference memory cells CD01 and CD11. The average value is read out from the bit lines BL0 and BL1. The reference potential used when reading out the potentials of the bit line /BL2 and bit line /BL3 is the average of the ferroelectric capacitor for reference memory cells CD21 and CD31. The average value is read out from the bit lines BL0 and BL1.

Therefore, in the constitution shown in FIG. 7, for eight word lines WL0 to WL7, there are four types of reference potential.

However, the reference memory cell system of the conventional ferroelectric memory cell device of 1T1C type had the following problems.

That is, hitherto, two ferroelectric capacitors for reference memory cells in which H (high) and L (low) data are written individually (for example, ferroelectric capacitors for reference memory cells CD00 and CD10) were electrically connected, both potentials were averaged, and the average was used as the reference potential for reading out the data. As a result, due to fluctuations of these ferroelectric capacitors for reference memory cells, the reference potentials were varied. As a result, the ideal reference potential which should be always the same value was not always obtained, and the yield of the ferroelectric memory device was lowered.

In particular, such fluctuations of ferroelectric capacitors for reference memory cells were closely related to the layout configuration, and if the configuration of the ferroelectric capacitors for reference memory cells and the ferroelectric capacitors for main body memory cells was remote from each other, an ideal reference potential could not be obtained.

Moreover, in the reference memory cell system of the conventional ferroelectric memory cell device of 1T1C type, the N-channel type MOS transistors and ferroelectric capacitors for reference memory cells as control signals and control switch elements were required in each bit line, which occupied a wide area in layout.

DISCLOSURE OF THE INVENTION

In the light of the problems of the prior art, it is hence an object of the invention to present a ferroelectric memory device capable of reducing the fluctuations of the reference potential substantially from the conventional level.

A present invention is a ferroelectric memory device for storing nonvolatile data in ferroelectric capacitors for main body memory cells, comprising: a plurality of first ferroelectric memory cells for storing substantially data of high level, a plurality of second ferroelectric memory cells for storing substantially data of low level, equalizing circuit means for averaging the potentials being read out from the first and second ferroelectric memory cells, and reading means for reading out the data stored in the ferroelectric capacitors for main body memory cells, by utilizing the averaged potential as a reference potential.

A present invention is a ferroelectric memory device for storing nonvolatile data in ferroelectric capacitors for main body memory cells, wherein word lines for selecting the ferroelectric capacitors for main body memory cells and bit lines used in reading of the potentials from the ferroelectric capacitors for main body memory cells are arranged in a matrix, comprising: a ferroelectric memory cell for reference shared for the different word lines, and reading means for reading out the data of the ferroelectric capacitors for main body memory cells, by utilizing the reference potential obtained on the basis of the potential being read out from the ferroelectric memory cell for reference.

REFERENCE NUMERALS

C00–C37 Ferroelectric capacitor for main body memory cell
CD00–CD31 Ferroelectric capacitor for reference memory cell
CPD Cell plate driver
SA0–SA3 Sense amplifier
CP Cell plate signal
WL0–WL7 Word line
RWL0, RWL1 Reference word line
REW0, REW1 Reference memory cell rewrite signal line
EQ0, EQ1 Reference potential signal line
BL0–BL3, /BL0–/BL3 Bit line
BP Bit line precharge signal
/SAP, SAN Sense amplifier control signal
VSS Grounding voltage
VDD Supply voltage Best Mode for Carrying Out the Invention Referring now to the drawings, embodiments of the invention are described below.

(Embodiment 1)

Figure 1:
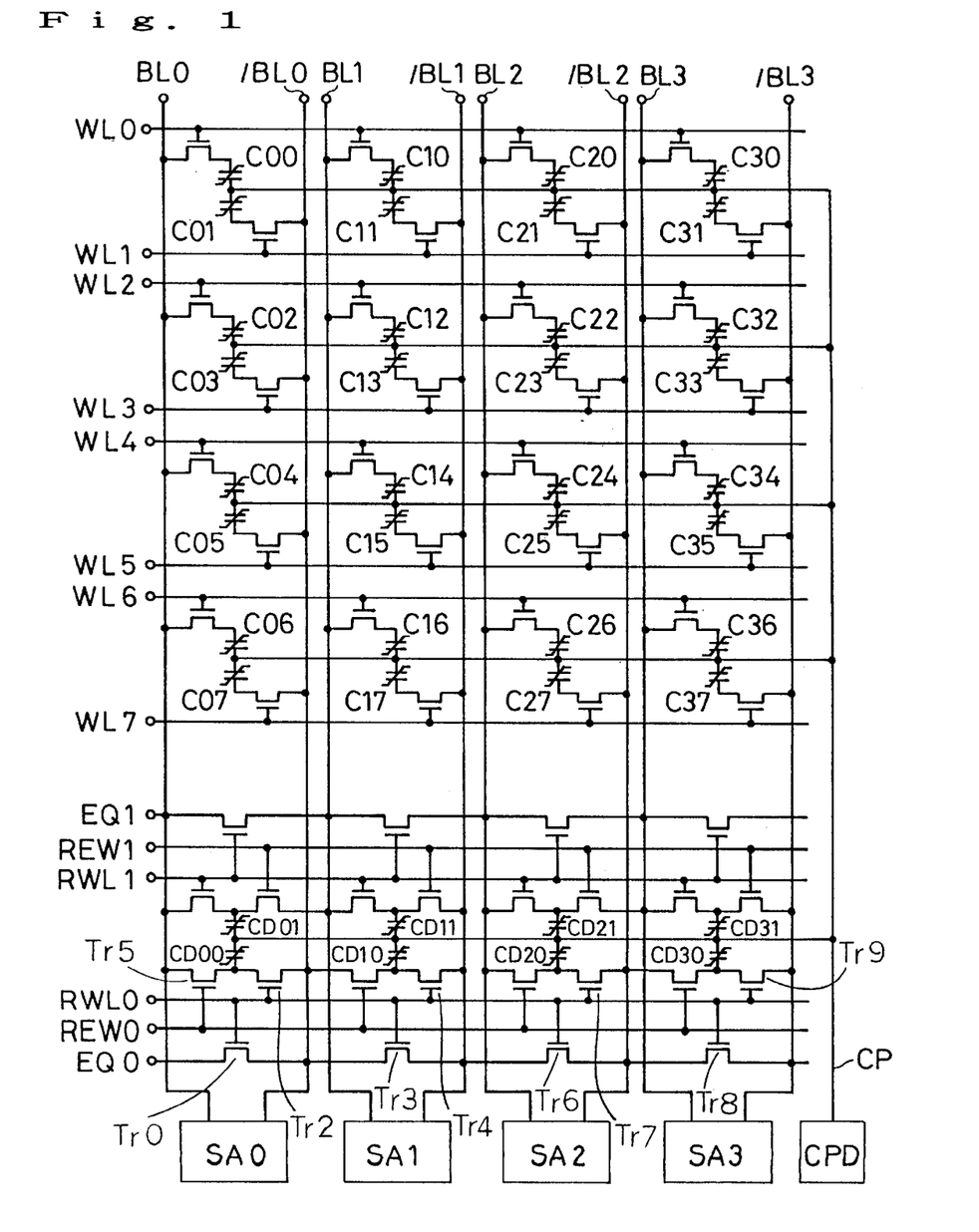
FIG. 1 is a memory cell block diagram in a first embodiment of the invention.

FIG. 1 shows a constitution of a ferroelectric memory device in a first embodiment of the invention, and the constitution of the invention is described below by referring to the drawing.

The sense amplifier circuit and the operation timing chart are same as in FIG. 8 and FIG. 9 relating to the prior art.

As shown in FIG. 1, C00 to C37 are ferroelectric capacitors for main body memory cells, and CD00 to CD31 are ferroelectric capacitors for reference memory cells. Besides, CPD is a cell plate driver, and REW0 and REW1 are reference memory cell rewrite signal lines. In the ferroelectric capacitors for reference memory cells CD00, CD20, suppose H (high) data is recorded and in the ferroelectric capacitors for reference memory cells CD10, CD30, suppose L (low) data is recorded. In the ferroelectric capacitors for reference memory cells CD01, CD21, suppose H (high) data is recorded, and in the ferroelectric capacitors for reference memory cells CD11, CD31, L (low) data is recorded.

In addition, EQ0 and EQ1 are reference potential signal lines, SA0 to SA3 are sense amplifiers, and CP is a cell plate signal line. And WL0 to WL7 are word lines, RWL0 and RWL1 are reference word lines, and BL0 to BL3, /BL0 to /BL3 are bit lines. Moreover, BP is a bit line precharge signal, and /SAP, SAN are sense amplifier control signals. Besides, VSS is a grounding voltage, and VDD is a supply voltage. The reference potential signal lines EQ0 and EQ1 are signal lines for generating reference potential when the reference word lines RWL0, RWL1 are selected.

As shown in the diagram, the word lines for selecting the ferroelectric capacitors for main body memory cells, and the bit lines used in reading of potentials are arranged in a matrix form. A memory cell array described later is composed of the ferroelectric capacitors for main body memory cells and others.

In the memory cell array composition, as shown in FIG. 1, bit lines BL0 to BL3, and /BL0 to /BL3 are connected to sense amplifiers SA0 to SA3. To the bit lines BL0 to BL3, ferroelectric capacitors for main body memory cells C00, C10, C20, C30 are connected through an N-channel MOS transistor having word line WL0 as its gate. To the bit lines /BL0, /BL1, /BL2, /BL3, ferroelectric capacitors for reference memory cells CD00, CD10, CD20, CD30 are connected respectively through N-channel MOS transistors Tr2, Tr4, Tr7, Tr9 having reference word line RWL0 as their gate.

The equalizing circuit is a circuit composed of N-channel MOS transistors Tr0, Tr3, Tr6, Tr8, etc. That is, the equalizing circuit is a circuit for averaging the potentials when the data stored in the ferroelectric capacitors for reference memory cells CD00, CD10, CD20, CD30 are read out as potentials from the bit lines /BL0, /BL1, /BL2, /BL3. The potential averaged by the equalizing circuit is a reference potential used for amplifying the data being read out from the ferroelectric capacitor for main body cell by the sense amplifier.

The ferroelectric capacitors C00 to C37, CD00 to CD31 are connected to a cell plate signal line CP driven by a cell plate driver CPD.

The bit line BL0 and ferroelectric capacitor for reference memory cell CD00 are connected through the N-channel MOS transistor Tr5 having the reference memory cell rewrite signal line REW0 as its gate. The other bit lines /BL0, BL2, /BL2 are connected, like the bit line BL0, to the ferroelectric capacitors for reference memory cell CD10, CD20, CD30, respectively, through the N-channel MOS transistors.

The sense amplifier SA0 is controlled by the sense amplifier control signals /SAP, SAN, and the circuit is composed so that the precharge of the bit lines BL0 to BL3 and /BL0 to /BL3 is controlled by the bit line precharge signal BP. The reading means of the invention corresponds to the sense amplifier SA0, etc.

In this first embodiment, using four ferroelectric capacitors nearly in the same size as the ferroelectric capacitors for main body memory cells, H data is read out from two of them, and L data from the other two, and these data are averaged.

The operation of the embodiment is described below.

The operation timing of the embodiment is same as in the prior art shown in FIG. 9.

Herein, major different points from the prior art are described. That is, in the prior art, as mentioned above, using one H data and one L data, they were averaged to obtain a reference potential. By contrast, in the embodiment, using a plurality of H data and a plurality of L data, they are averaged to obtain a reference potential, which is essential different from the prior art.

In this way, in the ferroelectric memory device of the embodiment, when the word line WL0 is selected, the reference potential utilized when reading out the potentials of the bit lines BL0, BL1, BL2, BL3 is the average value of the ferroelectric capacitors for reference memory cells CD00, CD10, CD20, and CD30. The average is read out from the bit lines /BL0, /BL1, /BL2, /BL3.

When the word line WL1 is selected, on the other hand, the role of the bit line pair is reverse from the above case, and the ferroelectric capacitors for reference memory cells are also different.

That is, the reference potential utilized when reading out the potentials of the bit lines /BL0, /BL1, /BL2, /BL3 is the average value of the ferroelectric capacitors for reference memory cells CD01, CD11, CD21, and CD31. This average is read out from the bit lines BL0, BL1, BL2, and BL3.

Therefore, in the constitution shown in FIG. 1, for eight word lines WL0 to WL7, there are two types of reference potentials. The first ferroelectric memory cell of the invention corresponds, for example, to the ferroelectric capacitors for reference memory cells CD00, CD20, and the second ferroelectric memory cell corresponds to the ferroelectric capacitors for reference memory cells CD10, CD30.

It is a feature of the first embodiment that a nearly ideal reference potential is obtained if there is a fluctuation in the ferroelectric capacitors for reference memory cells because plural H (high) data and plural L (low) data are averaged so that the effect is small.

Herein, four ferroelectric capacitors for reference memory cells (CD00 to CD30) are averaged, but not limited to this, the number of ferroelectric capacitors for reference memory cells to be averaged may be freely increased.

It is thus evident that the effect of fluctuation of ferroelectric capacitors for reference memory cells will be smaller when the number of ferroelectric capacitors for reference memory cells to be averaged is increased.

For example, comparing the average of 16 pieces and the average of 2 pieces, suppose one ferroelectric capacitor to issue H (high) data actually delivers L (low data), the deviation from the ideal reference potential can be suppressed to 1/8.

In this way, the deviation from the ideal reference potential can be suppressed small, and therefore when a certain operation margin is provided in the sense amplifier, a ferroelectric memory device operating normally more securely will be obtained.

(Embodiment 2)

Figure 2:
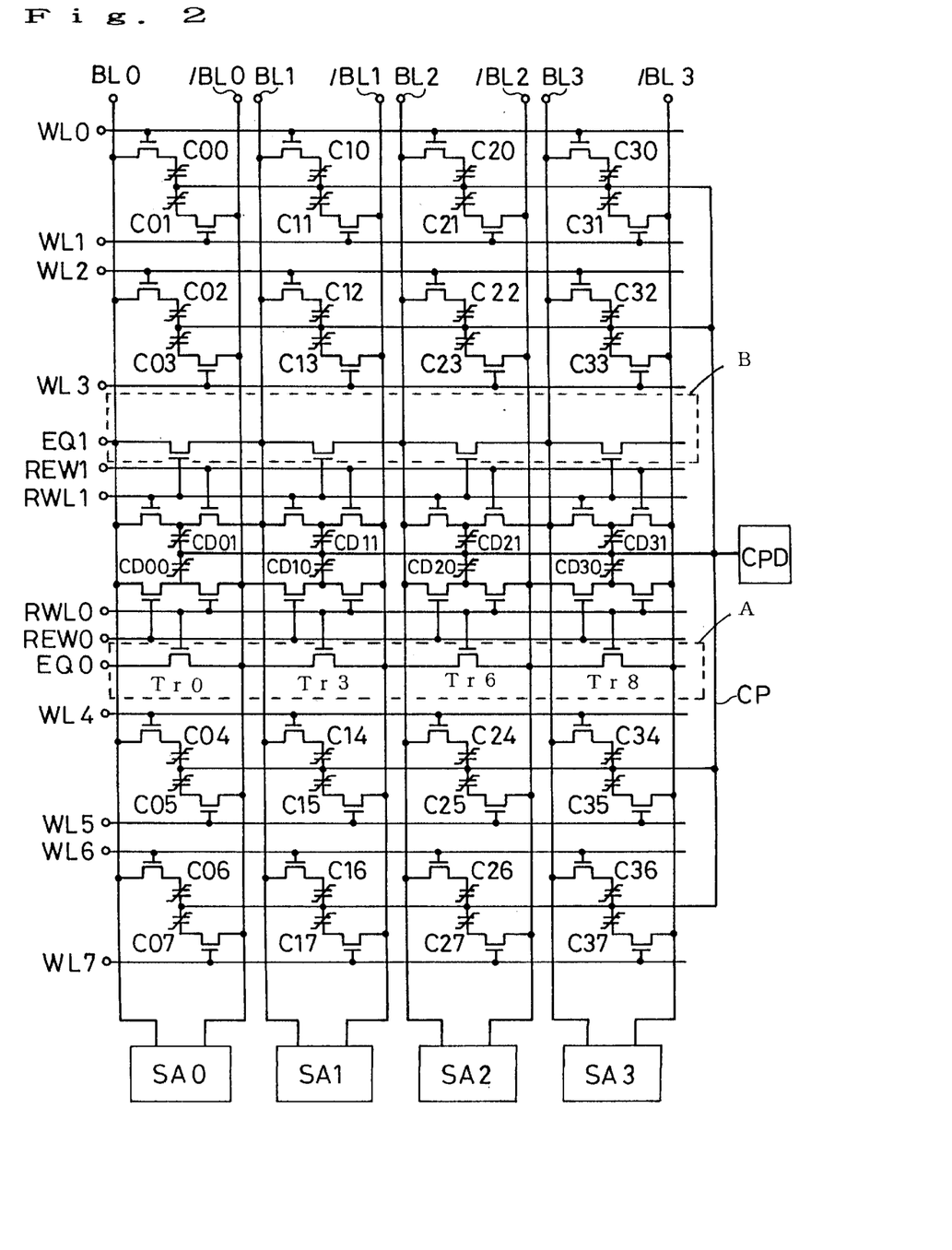
FIG. 2 is a memory cell block diagram in a second embodiment of the invention.

FIG. 2 is a memory cell block diagram of a ferroelectric memory device in a second embodiment of the invention, and the constitution and operation of the embodiment are described by referring to the diagram.

The constitution of the embodiment is basically same as in the first embodiment, including the electric connection, except for the following points.

That is, it is a feature of the embodiment that ferroelectric capacitors for reference memory cells CD00 to CD31, reference potential generating circuit including equalizing circuits, and cell plate driver CPD are arranged near the center of the length direction of bit lines as shown in FIG. 2.

The equalizing circuit in the embodiment is composed of a first equalizing circuit A and a second equalizing circuit B as shown in FIG. 2.

That is, the first equalizing circuit A is a circuit composed of N-channel MOS transistors Tr0, Tr3, Tr6, Tr8, etc. More specifically, the equalizing circuit is a circuit for averaging the potentials when various data stored in the ferroelectric capacitors for reference memory cells CD00, CD10, CD20, CD30 are read out as potentials from the bit lines /BL0, /BL1, /BL2, /BL3. The averaged potential is generated in signal line EQ0.

Same as the first equalizing circuit A, the second equalizing circuit B is provided. That is, the second equalizing circuit B is a circuit for averaging the potentials when various data stored in the ferroelectric capacitors for reference memory cells CD01, CD11, CD21, CD31 are read out as potentials from the bit lines BL0, BL1, BL2, BL3. The averaged potential is generated in signal line EQ1.

By arranging the reference potential generating circuit nearly in the center of the length direction of the bit lines as shown in the diagram, the following effects are brought about.

That is, if there is a variance in characteristics depending on the location of the ferroelectric capacitors, since the ferroelectric capacitors for reference memory cells are located near the center of the ferroelectric capacitor group for main body memory cells, the effects may be minimized.

Similarly, by arranging the cell plate driver CPD at the right side of the bit line /BL3 and near the center of the length direction of the bit lines as shown in the diagram, the following effects are brought about.

That is, the effect of delay difference in driving timing by the cell plate driver CPD is decreased, and high speed operation is enabled. For example, between when the ferroelectric capacitor for main body memory cell C00 is selected, and when the ferroelectric capacitors for main body memory cell C06 is selected, the delay difference in the timing of cell plate signal can be decreased. More specifically, in FIG. 2, the timing delay difference is about half that of the constitution shown in FIG. 1.

(Embodiment 3)

Figure 3:
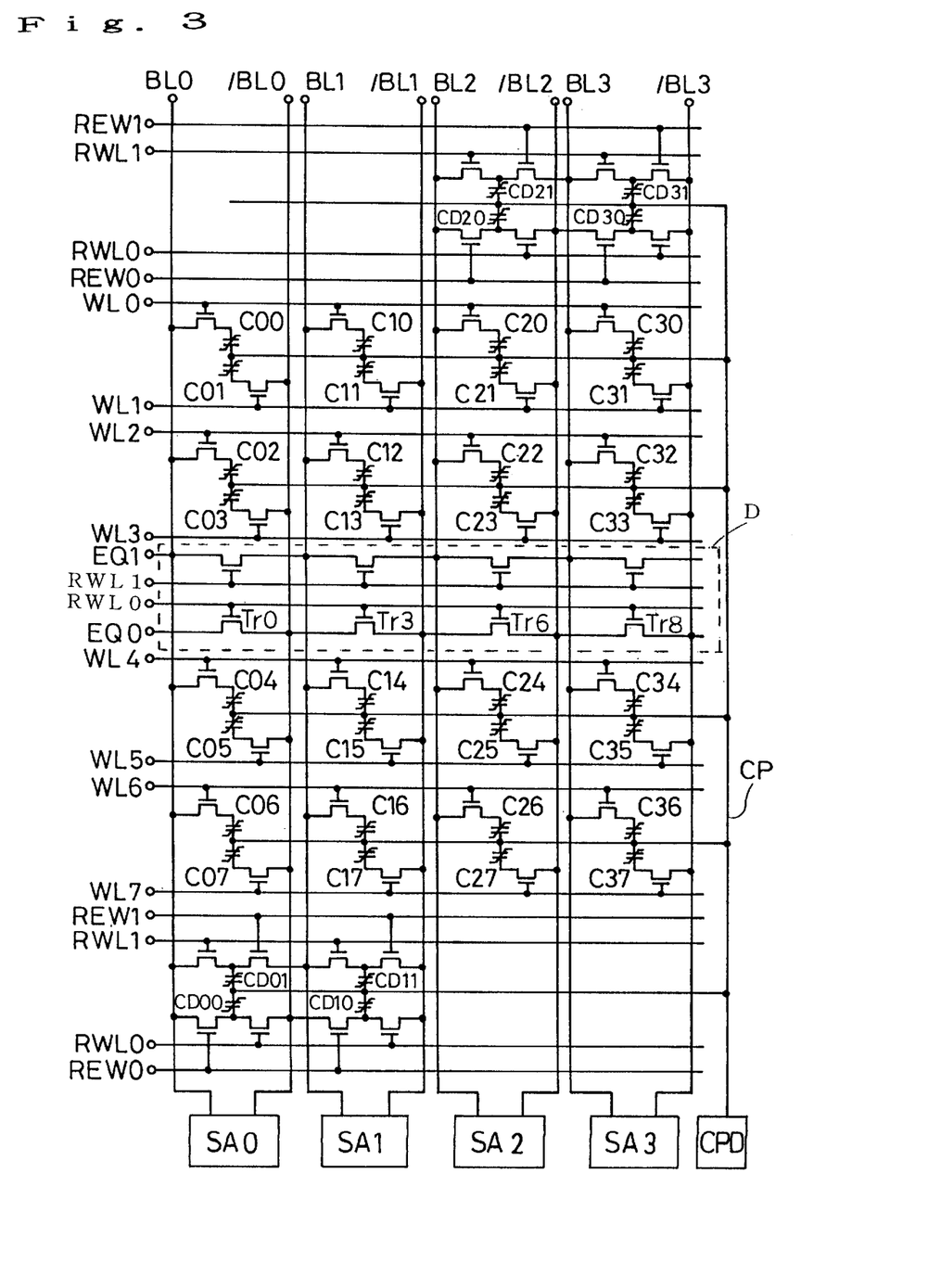
FIG. 3 is a memory cell block diagram in a third embodiment of the invention.

FIG. 3 is a memory cell block diagram of a ferroelectric memory device in a third embodiment of the invention, and the constitution and operation of the embodiment are described by referring to the diagram.

The constitution of the embodiment is basically same as in the first embodiment, except for the following points.

That is, it is a first feature of the embodiment that ferroelectric capacitors for reference memory cells are dispersed in plural positions in the length direction of the bit lines.

More specifically, the ferroelectric capacitors for reference memory cells CD00, CD01, CD10, CD11 are located near the sense amplifiers SA0, SA1, and the ferroelectric capacitors for reference memory cells CD20, CD21, CD30, CD31 are located away from the sense amplifiers SA2, SA3.

It is a second feature that, as shown in FIG. 3, an equalizing circuit D is positioned near the center of the length direction of the bit lines.

By thus dispersing the ferroelectric capacitors for reference memory cells, the effect of variance of characteristics of the ferroelectric capacitors in layout can be decreased, and when the H (high) data and L (low) data are averaged, the effect due to difference in the time difference in the length direction of the bit lines of the averaged potential can be decreased, and it is also effective for high speed operation.

That is, as shown in FIG. 3, the cell plate signal line connected to the ferroelectric capacitors for reference memory cells CD00, CD10 is close to the cell plate driving circuit CPD, and hence the potential occurs early. On the other hand, the cell plate signal line connected to the ferroelectric capacitors for reference memory cells CD20, CD30 is remote from the cell plate driving circuit CPD, and hence the potential occurs late. By averaging these ferroelectric capacitors for reference memory cells CD00, CD10, and CD20, CD30, the occurrence speed of the reference potentials is averaged. Therefore, effects of difference in reference potentials due to time difference in the length direction of the bit lines can be decreased.

Herein, the bit line equalizing circuits for generating reference potentials are located at one position near the center of the length direction of the bit lines, but they may be also located at the near side and remote side of the sense amplifiers. It is also possible to install the ferroelectric capacitors for reference memory cells near the center of the length direction of the bit lines.

Figure 4:
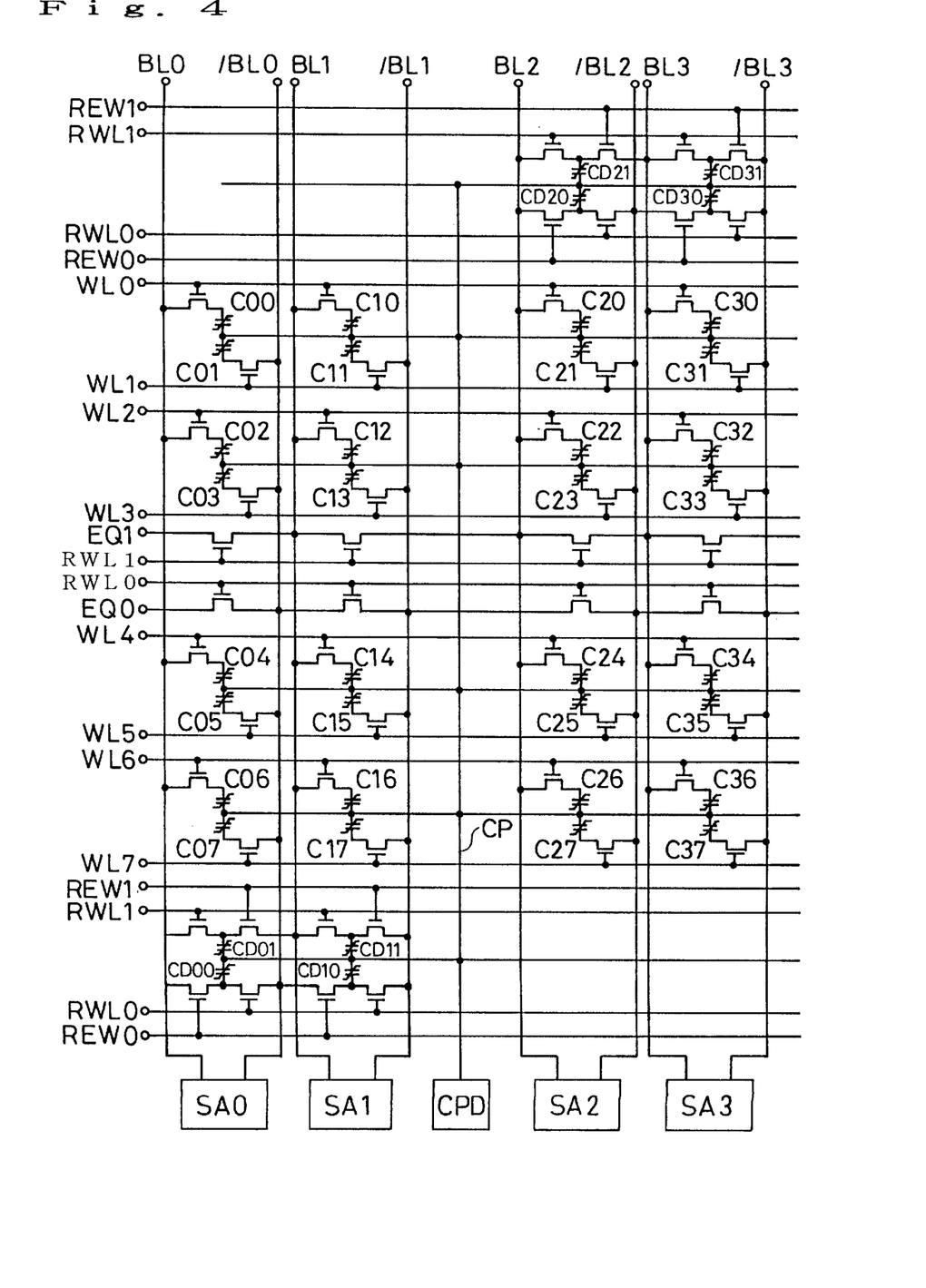
FIG. 4 is a memory cell block diagram in other example of the third embodiment of the invention.

Other example shown in FIG. 4 is described briefly.

In this example, as shown in the diagram, as compared with the constitution explained in FIG. 3, what differs is that the cell plate driver CPD is located substantially in the center of the array of a plurality of bit lines and along the array. The other constitution is same as shown in FIG. 3, and its explanation is omitted.

As a result, the length from the cell plate signal line CP to each ferroelectric capacitor for reference memory cell is uniform. Accordingly, the location dependence of the delay time in driving of the cell plate driving circuit CPD is small, and the timing difference is small.

(Embodiment 4)

Figure 5:
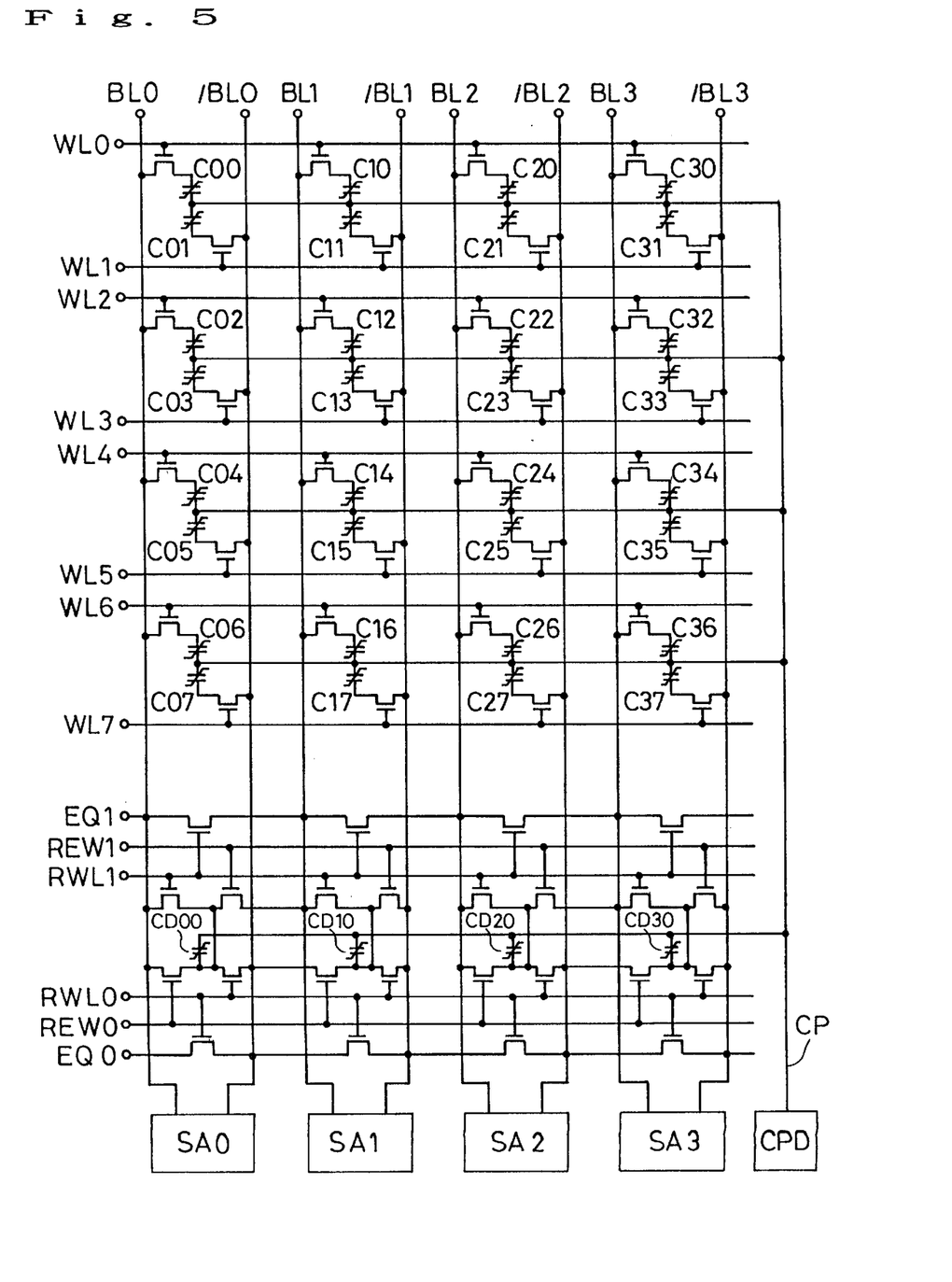
FIG. 5 is a memory cell block diagram in a fourth embodiment of the invention.

FIG. 5 is a memory cell block diagram of a ferroelectric memory device in a fourth embodiment of the invention, and the constitution and operation of the embodiment are described by referring to the diagram.

It is a feature of the fourth embodiment that one ferroelectric capacitor for reference cell memory is selectively connected to plural bit lines, so that the layout area of the ferroelectric capacitors for reference memory cells for generating reference potentials can be saved.

In the memory cell composition, as shown in FIG. 5, bit lines BL0 to BL3, and /BL0 to /BL3 are connected to sense amplifiers SA0 to SA3. To the bit lines BL0 to BL3, ferroelectric capacitors for main body memory cells C00, C10, C20, C30 are connected through an N-channel MOS transistor having word line WL0 as its gate. To the bit lines /BL0 to /BL3, ferroelectric capacitors for reference memory cells CD00, CD10, CD20, CD30 are connected respectively through an N-channel MOS transistor having reference word line RWL0 as its gate. To the bit lines BL0 to BL3, moreover, the ferroelectric capacitors for reference memory cells CD00, CD10, CD20, CD30 are connected respectively through an N-channel MOS transistor having reference word line RWL1 as its gate. That is, the ferroelectric capacitors for reference memory cells CD00, CD10, CD20, CD30 can be connected to both bit lines BL0 to BL3, and bit lines /BL0 to /BL3.

The ferroelectric capacitors C00 to C37, CD00 to CD31 are connected to a cell plate signal line CP driven by a cell plate driver CPD. The bit lines /BL0 to /BL3 are connected through an N-channel MOS transistor having reference word line RWL0 as its gate. The bit lines BL0 to BL3 and ferroelectric capacitors for reference memory cells CD00, CD10, CD20, CD30 are connected through an N-channel MOS transistor having the reference memory cell rewrite signal line REW0 as its gate.

The sense amplifier SA0 is controlled by the sense amplifier control signals /SAP, SAN, and the circuit is composed so that the precharge of the bit lines BL0 to BL3 and /BL0 to /BL3 is controlled by the bit line precharge signal BP.

In the fourth embodiment, too, same as in the first embodiment, using four ferroelectric capacitors nearly in the same size as the ferroelectric capacitors for main body memory cells, H (high) data is read out from two of them, and L (low) data from the other two, and these data are averaged.

Thus, in the ferroelectric memory device of the embodiment, in the case the word line WL0 is selected, the reference potential utilized when reading out the potentials of the bit lines BL0, BL1, BL2, BL3 is the average value of the ferroelectric capacitors for reference memory cells CD00, CD10, CD20, and CD30. This average is read out from the bit lines /BL0, /BL1, /BL2, and /BL3.

In the case the word line WL1 is selected, the role of the bit line pair is reverse, but the same ferroelectric capacitors for reference memory cells as above are used.

Therefore, in the constitution shown in FIG. 5, for eight word lines WL0 to WL7, there is one type of reference potential. The first ferroelectric memory cell of the invention corresponds, for example, to the ferroelectric capacitors for reference memory cells CD00, CD20, and the second ferroelectric memory cell corresponds to the ferroelectric capacitors for reference memory cells CD10, CD30.

Herein, one ferroelectric capacitor for reference memory cell is shared by a pair of two bit lines, but it may be also shared by more bit lines. As in the fourth embodiment, the layout of sharing by a pair of two bit lines is small in the number of layers and is relatively simple. The layout area of the fourth embodiment is half in the number of ferroelectric capacitors for reference memory cells as compared with the first embodiment.

Incidentally, the reference potential generating circuit and the bit line equalizing circuit for generating reference potential can be also installed near the center of the length direction of the bit lines.

Figure 6:
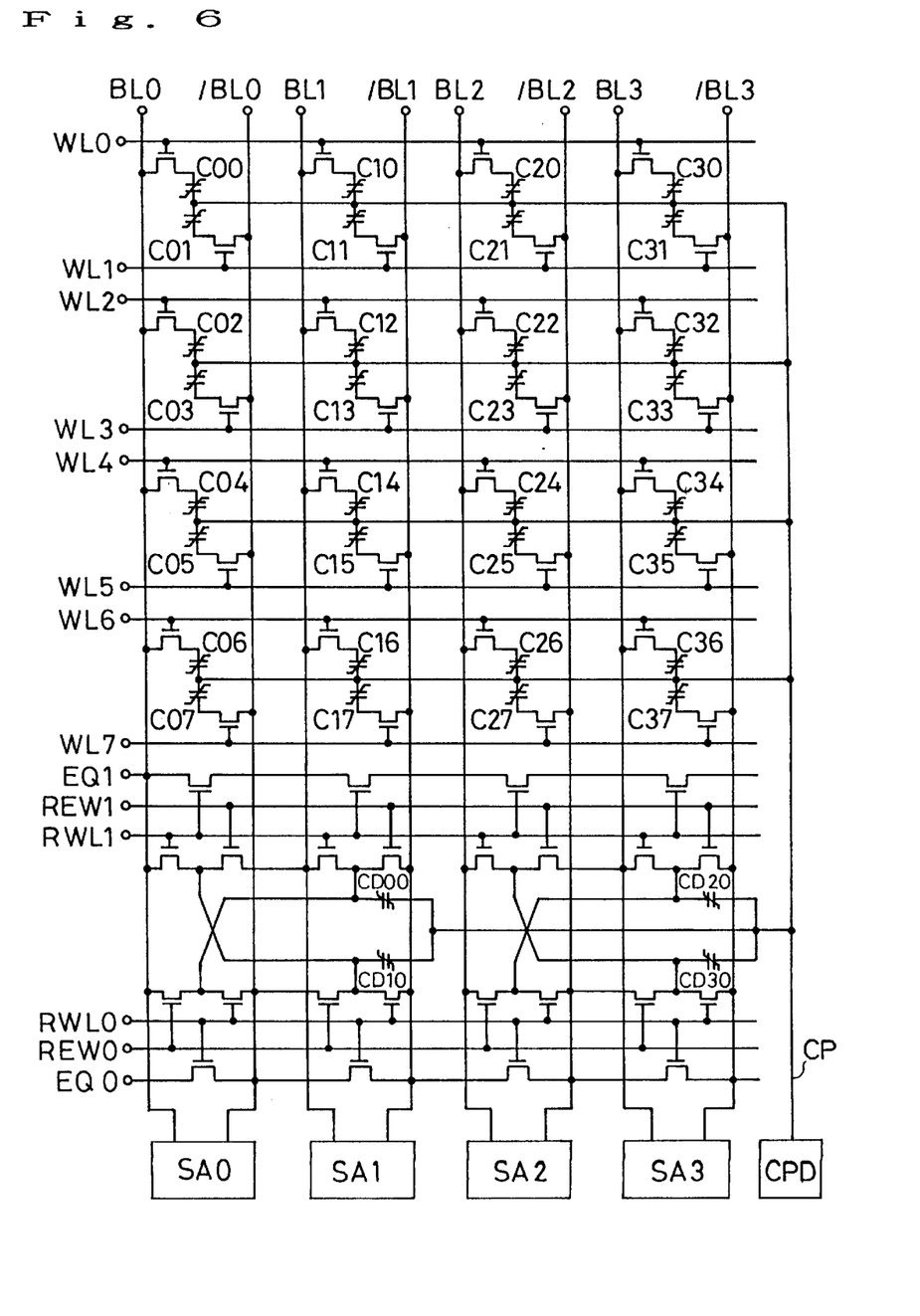
FIG. 6 is a memory cell block diagram in other example of the fourth embodiment of the invention.

Other example shown in FIG. 6 is briefly described.

As shown in the diagram, this embodiment is a different example of the embodiment shown in FIG. 5.

That is, in FIG. 5, for example, the ferroelectric capacitor for reference memory cell CD00 is shared by a pair of bit lines (for example, a pair of bit lines BL0 and /BL0 connected to a certain sense amplifier SA0). By contrast, in FIG. 6, it is shared between different pairs of bit lines. For example, as shown in FIG. 6, the ferroelectric capacitor for reference memory cell CD00 is shared between the bit line /BL0 and bit line BL1.

Thus according to the embodiment, since the ferroelectric capacitor for reference memory cell is shared by different word lines, the number of the ferroelectric capacitors for reference memory cells can be saved same as in the above embodiment.

Therefore, in the embodiment, if there are fluctuations in the ferroelectric capacitors for reference memory cells, a nearly ideal reference potential can be obtained.

Moreover, by the layout of ferrodielectric capacitor for reference memory cell or equalizing circuit, a more ideal reference potential may be obtained, and it is effective to realize a ferrodielectric memory device of high speed operation.

Moreover, the layout area of ferroelectric capacitors for reference memory cells for generating reference potentials can be reduced.

As clear from the description so far, according to the invention as set forth in FIG. 1, since the potentials being read out from, for example, a plurality of ferroelectric capacitors for reference memory cells for storing data of high level, and a plurality of ferroelectric capacitors for reference memory cells for storing data of low level are averaged, if there are fluctuations in the ferroelectric capacitors for reference memory cells, the effects are small, and a reference potential having a smaller fluctuation than in the prior art can be obtained. In addition, since the equalizing circuit is connected between plural bit lines, it is effective to save the layout area of ferroelectric capacitors for reference memory cells for generating reference potentials.

Comparing the invention as set forth in FIG. 2, to the invention of FIG. 1, for example, by connecting the equalizing circuit between plural bit lines and locating near the center of the length direction of the bit lines, effects by location of equalizing state of bit lines can be decreased, and a nearly ideal reference potential can be obtained at each position of bit lines.

According to the invention, for example, by connecting the ferroelectric capacitor for reference memory cell to plural bit lines, and locating near the center of the length direction of the bit lines, effects due to locations of the ferroelectric capacitors for reference memory cells and ferroelectric capacitors for main body memory cells are decreased, and if there are fluctuations among the ferroelectric capacitors for reference memory cells, the effects are small, and a nearly ideal reference potential can be obtained.

Comparing the invention as set forth in FIG. 4, to the invention of FIG. 1, for example, by connecting the ferroelectric capacitor for reference memory cell to plural bit lines, and locating near the center of the length direction of the bit lines, effects due to locations of the ferroelectric capacitors for reference memory cells and ferroelectric capacitors for main body memory cells are decreased, and if there are fluctuations among the ferroelectric capacitors for reference memory cells, the effects are small, and a nearly ideal reference potential can be obtained.

According to the invention as set forth in FIG. 4, for example, effects of delay difference in driving timing by cell plate driver CPD can be decreased, and high speed operation is realized.

According to the invention as set forth in any one of claims the embodiments, a nearly ideal reference potential can be obtained, so that it is effective for realizing a ferroelectric memory device capable of operating at high speed.

According to the invention as set forth in FIG. 5, for example, by connecting a certain ferroelectric capacitor for reference memory cell to plural bit lines through a switch element, the layout area of the ferroelectric capacitors for reference memory cells for generating reference potentials is smaller than in the prior art. Also combining with the constitution of FIG. 1, effects of fluctuations of ferroelectric capacitors for reference memory cells are small, and a nearly ideal reference potential is obtained, while the layout area is saved.

According to the invention as set forth in FIG. 5, for example, by connecting one ferroelectric capacitor for reference memory cell to a pair of two bit lines connected to sense amplifiers through switch elements, the layout area of the ferroelectric capacitors for reference memory cells for generating reference potentials is smaller than in the prior art. In this case, as compared with the above example, since only the ferroelectric capacitor for reference memory cell is shared by a pair of two bit lines, the frequency of use of ferroelectric capacitor for reference memory cell is low, which is advantageous for the service life. It is only required to install switch elements between a pair of two confronting bit lines, and hence the layout area is small.

Industrial Applicability

As described herein, the ferroelectric memory device of the invention comprises, for example, a plurality of first ferroelectric memory cells for storing substantially data of high level, a plurality of second ferroelectric memory cells for storing substantially data of low level, equalizing circuit means for averaging the potentials being read out from the first and second ferroelectric memory cells, and reading means for reading out the data stored in the ferroelectric capacitors for main body memory cells, by utilizing the averaged potential as a reference potential, and therefore fluctuations of the reference potential may be suppressed further as compared with the prior art.

I claim:

1. A ferroelectric memory device for storing nonvolatile data in ferroelectric capacitors for main body memory cells, having
    a plurality of word lines for selecting the ferroelectric capacitors for the main body memory cells and a plurality of bit lines for reading of potentials from the ferroelectric capacitors for the main body memory cells, wherein the main body memory cells are arranged in a matrix and include the ferroelectric capacitors, comprising:
    a plurality of first ferroelectric reference memory cells for storing substantially data of high level,
    a plurality of second ferroelectric reference memory cells for storing substantially data of low level,
    equalizing circuit means for averaging the potentials being read out from the plurality of first and second ferroelectric reference memory cells, and
    reading means for reading out the data stored in the ferroelectric capacitors for main body memory cells, by utilizing the averaged potential as a reference potential.

2. A ferroelectric memory device of claim 1, wherein the equalizing circuit means is connected to part or whole of the bit lines, out of the plural bit lines.

3. A ferroelectric memory device of claim 2, wherein the equalizing circuit means is located substantially near a center of a length direction of the bit lines.

4. A ferroelectric memory device of claim 1, wherein the first and second ferroelectric reference memory cells are connected to part or whole of the bit lines, out of the plural bit lines.

5. A ferroelectric memory device of claim 3, wherein the first and second ferroelectric reference memory cells are dispersed at plural positions in a length direction of the bit lines.

6. A ferroelectric memory device of claim 4, wherein the first and second ferroelectric reference memory cells are located substantially near a center of a length direction of the bit lines.

7. A ferroelectric memory device of claim 1, further comprising:
    cell plate driving means for applying a specified potential to the ferroelectric capacitors for the main body memory cells.

8. A ferroelectric memory device of claim 7, wherein the cell plate driving means is located near a center of a length direction of the bit lines.

9. A ferroelectric memory device of claim 7, wherein the cell plate driving means is located substantially near a center of the array of the plurality of bit lines.

10. A ferroelectric memory device for storing nonvolatile data in ferroelectric capacitors for main body memory cells, wherein word lines for selecting the ferroelectric capacitors for main body memory cells and bit lines used in reading of potentials from the ferroelectric capacitors for the main body memory cells are arranged in a matrix, comprising:
    a ferroelectric memory cell for reference shared by different word lines, and
    reading means for reading out data of the ferroelectric capacitors for main body memory cells, by utilizing the reference potential obtained from the ferroelectric memory cell for reference, wherein the ferroelectric memory cell for reference is connected through switch elements corresponding to a pair of two bit lines connected to the reading means.

11. A ferroelectric memory device for storing nonvolatile data in ferroelectric capacitors for main body memory cells, wherein word lines for selecting the ferroelectric capacitors for main body memory cells and bit lines used in reading of the potentials from the ferroelectric capacitors for main body memory cells are arranged in a matrix, comprising:
    a ferroelectric memory cell for reference shared between different bit lines, and
    reading means for reading out the data of the ferroelectric capacitors for main body memory cells, by utilizing the reference potential from the ferroelectric memory cell for reference,
    wherein the ferroelectric memory cell for reference is connected through switch elements corresponding to one of a pair of two bit lines connected to a first reading means and the other of a pair of two bit lines connected to a second reading means.

* * * * *

UNITED STATES PATENT AND TRADE MARK OFFICE
CERTIFICATE OF CORRECTION

PATENT NO. : 5,969,979
DATED : October 19, 1999
INVENTOR(S) : Hirano

It is certified that error appears in the above-identified patent and that said Letters Patent is hereby corrected as shown below:

Cover page, item [54] Title, delete "FERROELECRIC MEMORY DEVICE" and insert --POTENTIAL REFERENCE FOR A FERROELECTRIC MEMORY DEVICE--.

Column 12, line 11, delete "3" and insert --4--.

Signed and Sealed this

Second Day of January, 2001

*Attest:*

Q. TODD DICKINSON

*Attesting Officer*   Commissioner of Patents and Trademarks